United States Patent [19]

Games et al.

[11] B 3,997,893

[45] Dec. 14, 1976

[54] SYNCHRO DIGITIZER

[75] Inventors: John E. Games, Granby; Henry E. Martin, Wapping; Kirk S. Walworth, Rockville, all of Conn.

[73] Assignee: United Technologies Corporation, Hartford, Conn.

[22] Filed: July 10, 1972

[21] Appl. No.: 270,351

[44] Published under the second Trial Voluntary Protest Program on March 30, 1976 as document No. B 270,351.

Related U.S. Application Data

[63] Continuation of Ser. No. 95,167, Dec. 4, 1970.

[52] U.S. Cl. .......................................... 340/347 SY

[51] Int. Cl.$^2$ ..................... H03K 13/02; H03D 3/04

[58] Field of Search .............................. 340/347 SY

[56] References Cited

UNITED STATES PATENTS

| | | | |
|---|---|---|---|
| 3,258,698 | 6/1966 | Asher | 340/347 SY |
| 3,438,026 | 4/1969 | Prill | 340/347 SY |
| 3,460,130 | 8/1969 | Lavin | 340/347 SY |
| 3,490,016 | 1/1970 | Taylor | 340/347 SY |
| 3,505,669 | 4/1970 | Welch | 340/347 SY |
| 3,676,659 | 7/1972 | Asmussen | 340/347 SY |

*Primary Examiner*—Malcolm A. Morrison
*Attorney, Agent, or Firm*—M. P. Williams

[57] ABSTRACT

The differences between two pairs of the three windings of a synchro stator are individually scaled so as to provide a function of the rotor angle plus a 45° phase lead. The scaled values are applied to a CR/RC bridge, the output of which bears a phase relationship relating directly to the synchro rotor angle, but is identical for shaft angles from 0° to 180° and from 180° to 360°. These signals are shaped and applied to a pulsewidth modulator; the pulsewidth modulation ambiguity is resolved by generation of a sign bit indicative of angles between 180° and 360°. The pulsewidth modulated output is converted to an analog level, as is the reference supply voltage, and an analog to digital converter provides a digital output as a function of the ratio of the angle voltage level to the reference voltage level. The sign bit is provided as an additional digital bit thereby providing a digital output indication of shaft angle. Multiplexing of synchro inputs to the apparatus may be provided if desired.

6 Claims, 8 Drawing Figures

ROTARY DEVICE
400~ SPLY
SYNCHRO RESPONSIVE MEANS
EXISTING SYSTEM
SYNCHRO DIGITIZER FIG. 2

400~
FROM FIG. 1
DIFL AMP
DIFL AMP
SUM & SCALE FIG. 3
RC/CR Ø BRDG FIG. 4
SAT AMP
SAT AMP
SAT AMP
PWM
COMB'L SIGN LOGIC FIG. 8
HOLD
HOLD FIG. 5
A/D
180°-360°
OUTPUT

ELECTRICAL TIMING

FIG. 7 MECHANICAL ANGLE RELATIONSHIPS
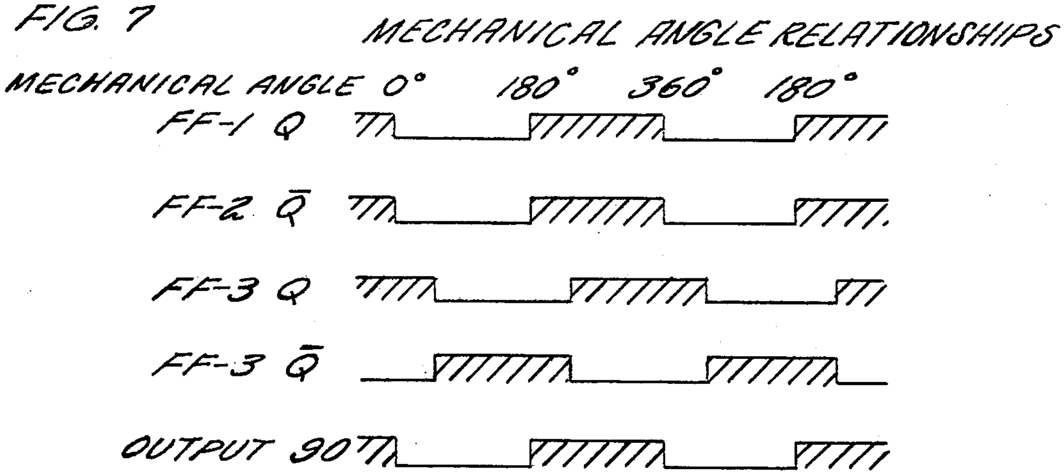
FIG. 8 COMBINATION SIGN LOGIC
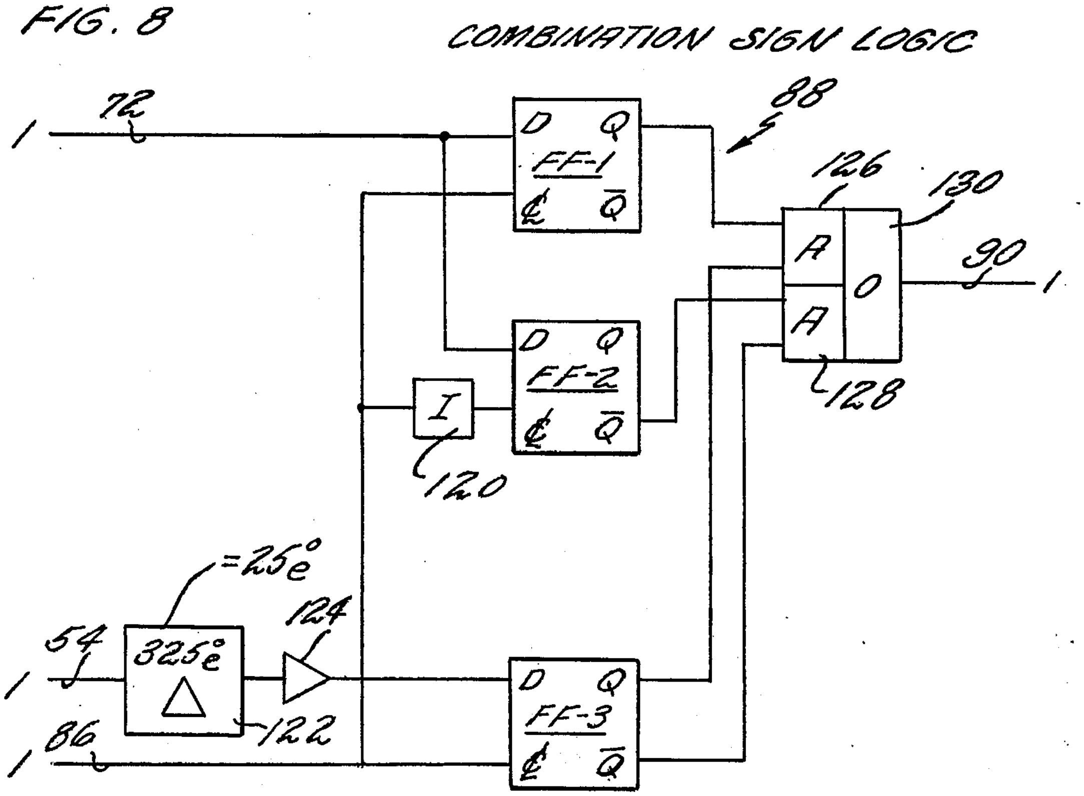

SYNCHRO DIGITIZER

This is a continuation, of application Ser. No. 95,167, filed Dec. 4, 1970.

BACKGROUND OF THE INVENTION

1. Field of Invention

This invention relates to analog/digital converters and to shaft angle encoders, and more particularly to apparatus for providing a digital indication of a synchro rotor angle.

2. Description of the Prior Art

As is well known, there are many fields of applications for measuring the angle of a shaft or other rotary devices. To simplify illustration of the environment and background of the present invention, consider airborne systems, particularly those found on commercial and military aircraft. All existing airborne systems include rotary devices and means for determining the current angular position of such devices. For instance, synchronous generators, better known as, and referred to hereinafter as synchros, are utilized in many systems for a variety of purposes. In some cases, it is possible to incorporate a direct shaft angle encoder in a synchro or other rotary device. Such encoders are commonly configured so as to provide a direct digital encoding of shaft angle, such as by optical means. However, there are a great many applications where such direct encoding devices are not incorporated in existing equipment, and wherein a need arises to provide a real-time indication of the angular position of such devices. One example is the provision of flight data recorders of various kinds; included among these are what are sometimes referred to as "crash recorders" which provide information of key aircraft parameters in a crash-proof recording system in order to assist in the analysis of events leading up to a crash. Another example is in airborne integrated data systems, such as the type disclosed in a copending application of the same assignee entitled SELECTIVE DATA HANDLING APPARATUS, Ser. No. 803,372, filed on Feb. 28, 1969 by Provanzano, Jr. et al now U.S. Pat. Re: 28,109. In such a system, since a digital airborne computer is utilized to control multiplexing of the various parameters and to perform limit and other parameter testing of the parameters, a direct digital input is to be preferred. Further, the information recorded by such systems is usually analyzed on a ground-based computer in order to determine characteristics of the manner of flight and characteristics of the aircraft, for instructional and diognostic purposes. A common form of digital representation of angular position known to the prior art is the conversion to a digital value of the values of the sine and cosine of the position angle. However, this either requires special equipment to convert from sine and cosine to a digital representation of angle, or requires that both the value of the sine and cosine be stored digitally on board the aircraft, with a conversion to occur in a ground based computer system. In cases where direct, on-line usage of angular position is desired, it is of course necessary that angle be encoded on a real-time basis (or substantially so). Many position angle encoding devices known to the prior art require integration over many cycles, and thus defeat this purpose of real-time conversion. Also, high resolution and disambiguity of sine and cosine are difficult to achieve with prior systems.

SUMMARY OF THE INVENTION

The object of the present invention is to provide a substantially real-time, high resolution, unambiguous, relatively simple digital indication of angular position.

According to the present invention, an electrical bridge network is utilized to convert mechanical position-indicating, analog signals to electrical phase information; the input to the bridge is provided with an initial phase shift so that the output of the bridge is in phase with the indicated angular position; the output of the bridge includes means for generating a sign bit which resolves the ambiguity between angular positions of 0°–180° and angular positions of 180°–360°; the bridge output is also converted to a digital value, whereby the sign bit and digital value comprise a direct digital indication of angular position.

The present invention is relatively simple and reliable, and is capable of implementation in a manner to provide a high degree of accuracy and resolution. The invention provides a direct digital indication of angular position, at high speed, whereby it may be used on a real-time basis for on line control of other parameters. The invention is readily adapted for use with a wide variety of existing rotary devices having analog angular position outputs.

Other objects, features and advantages of the present invention will become more apparent in the light of the following detailed description of a preferred embodiment thereof, as illustrated in the accompanying drawing.

BRIEF DESCRIPTION OF THE DRAWING

FIG. 7 is a diagram illustrating shaft angle relationship to the combinational sign logic of FIG. 7; and FIG. 8 is a simplified schematic diagram of combinational sign logic for incorporation in the embodiment of FIG. 2.

DESCRIPTION OF THE PREFERRED EMBODIMENT

Figures 1, 2:
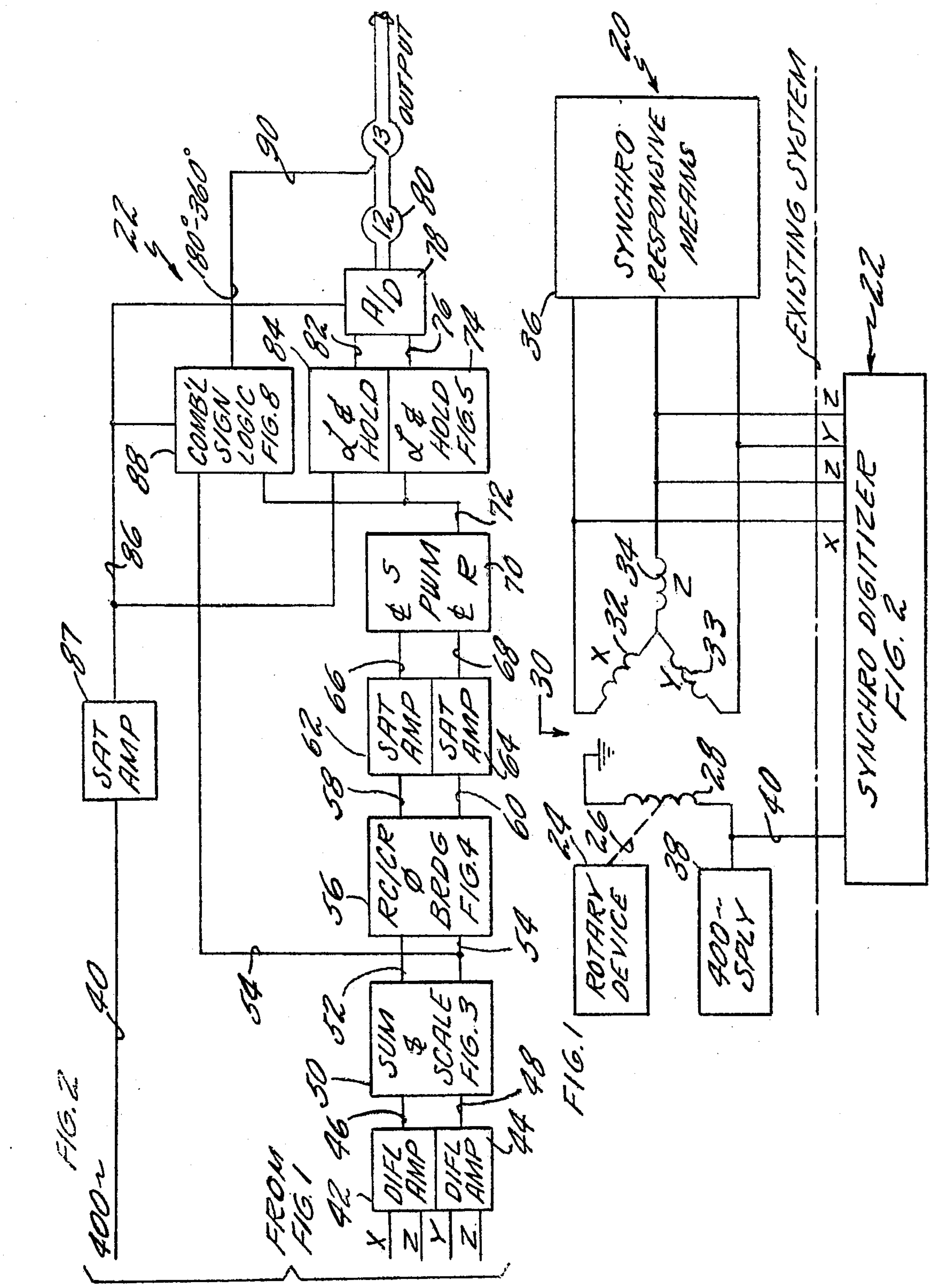
FIG. 1 is a simplified schematic block diagram of an existing system connected with a synchro digitizer in accordance with the present invention.
FIG. 2 is a schematic block diagram of a synchro digitizer in accordance with the present invention.

Referring now to FIG. 1, an existing system 20 is shown connected to a synchro digitizer 22 incorporating the present invention. The system 20 includes a rotary device 24 having a mechanical connection 26 to the rotor 28 of a synchro 30 having three equally phased stators winding 32–34. The stator outputs herein designated X, Y, Z are applied to a synchro responsive means 36. As an example, the rotary device 24 may comprise the rudder of the aircraft, and the synchro response means 36 may comprise an indicator (in the cockpit) of rudder position. The rotor 28 is connected to the aircraft power, such as a 400 Hz supply 38. The 400 Hz supply 38 is connected by a lead 40 to the synchro digitizer 22, as are each of the stator outputs X, Y and Z. As is clearly shown in FIG. 1, the synchronous digitizer 22 may be applied to an existing system by simply interconnecting the digitizer 22 with the system 20 by means of electrical connections (40, X, Y, Z).

Referring now to FIG. 2, the synchro digitizer 22 includes a pair of differential amplifiers 42, 44 which provide voltages on respective lines 46, 48 equal to the difference between the voltage on the stator winding 32 from that on the winding 34 and the voltage on stator winding 33 from that on winding 34, respectively. As is well known in the synchro art, the difference in these voltages is a function of the sine of the excitation voltage and the sine of the shaft angle as follows:

$$V_{XZ} = -K_1 \sin wt \sin(\theta + 60) \quad (1.)$$

and since sin 60 = $\sqrt{3/2}$, through the trigonometric relationship:

$$\sin(A+B) = \sin A \cos B + \cos A \sin B; \text{ then} \quad (2.)$$

$$V_{XZ} = -\frac{K_2}{2} \sin wt\,(\sqrt{3}\cos\Theta + \sin\Theta). \quad (3)$$

similarly:

$$V_{YZ} = -\frac{K_2}{2} \sin wt\,(\sqrt{3}\cos\Theta - \sin\Theta) \quad (4)$$

Figure 3:
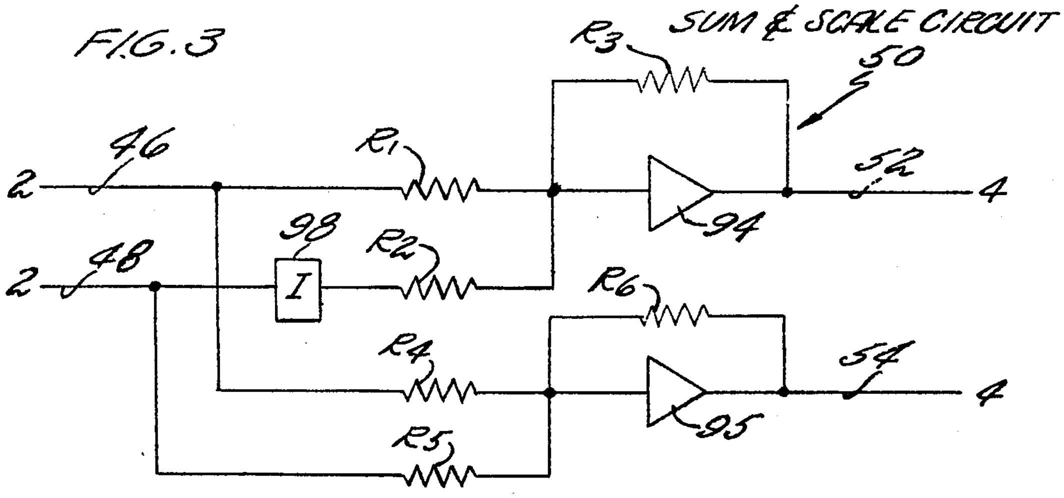
FIG. 3 is a simple schematic diagram of a summing and scale circuit for incorporation into the embodiment of FIG. 2.
Figure 4:
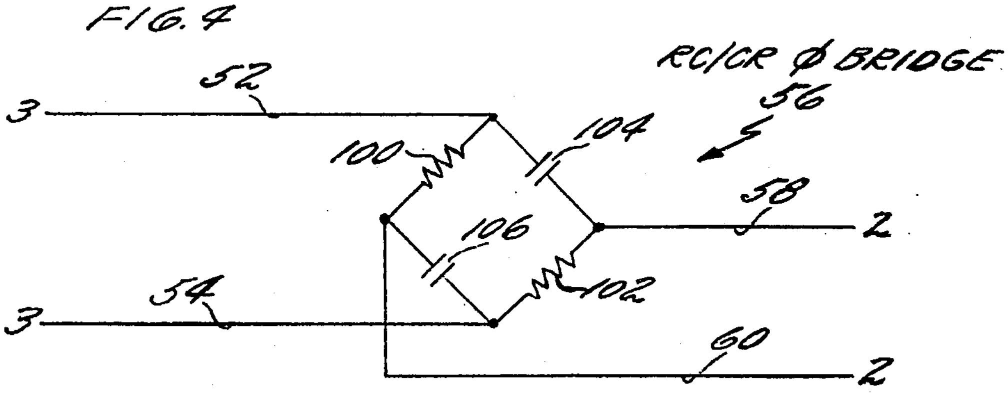
FIG. 4 is a simple schematic diagram of a phase bridge for use in the embodiment of FIG. 2.

The output of the differential amplifiers 42, 44 are applied to a summing and scaling circuit 50, the purpose and operation of which are described more fully with respect to FIG. 3; just roughly, this circuit provides, on a pair of outputs 52, 54, signals which correspond to the mechanical shaft angle advanced by 45° from the mechanical angle which relates to the signals provided by the differential amplifiers 42, 44. These signals are applied to a phase bridge 56 which preferably comprises a well known CR/RC bridge, as illustrated in FIG. 4, of the type having the characteristic that the phase of its output signals varies from 0° to 360° for input signals relating to mechanical positions of 0° to 180°, and also varies from 0° to 360° for input signals indicative of angular positions of 180° through 360°. This type of circuit normally provides a 45° phase offset of its electrical phase output at 0° mechanical angle input; but by building in a 45° phase advance with the circuit 50, this offset is compensated for at the output of the bridge on a pair of lines 58, 60. The outputs 58, 60 provide 400 Hz sinusoidal signals; the phase of these two signals, taken together, are representative of the angular position of the rotor 28 (FIG. 1). The sinusoidal signals on the lines 58, 60 are applied to respective high gain saturating amplifiers 62, 64 so as to generate square waves on lines 66, 68 of the same phase and frequency as the sinusoidal waves. These square wave indications are applied to a pulsewidth modulation circuit 70 which comprises a dual clocked flip flop device such that the fall of a signal on line 68 resets the device 70 to provide the output signal on a line 72, and the fall of a signal on line 66 sets the device, thus cutting-off the output signal on the line 72. The output of the circuit 70 on line 72 comprises a pulsewidth modulation indication of angular position, limited in the fact that it varies from zero to full width for angles of 0° through 180°, and also varies from zero to full width from angles between 180° and 360°, as described hereinbefore, and more fully hereinafter. The pulsewidth modulated indication of angle is applied to an integrate and hold circuit 74 which is illustrated in and described more fully hereinafter with respect to FIG. 5, the output of which, on a line 76, comprises a DC signal-levelequivalent of the pulsewidth modulation output on the line 72. This signal is applied to an analog to digital converter 78, the output of which is illustrated herein as comprising digital signal of 12 binary bits in a trunk of lines 80.

The analog to digital converter 78 may preferably be of the ramp type that provides an output which is a function of the ratio of the input signal to a reference signal such as on a line 82. Because of the fact that the signal level input to the A to D converter 78, which is a function of the position of the rotor 28, may vary in an undesirable fashion in response to frequency variations in the 400 Hz supply 38, the other input to the converter 78 on line 82 is taken from an integrate and hold circuit 84 of the same type as the circuit 74, the input to which comprises a 400 Hz square wave signal on a line 86, this signal being developed by a high gain saturating amplifier 87 in response to the 400 Hz supply voltage on the line 40. This is a second important feature of the present invention, since it provides a digital output which is independent of reasonable variations in the 400 Hz supply voltage.

In order to resolve the ambiguity of the digital output as between angular positions of 0°–180° and 180°–360°, a combinational sign bit generating logic circuit 88, which is illustrated in and described more fully hereinafter with respect to FIG. 7, generates a bit on a line 90 in the case where the angular position is between 180° and 360°, which is utilized as an additional digital output bit so as to provide an unambiguous digital output. The combinational sign bit generation logic 88 is responsive to the pulsewidth modulated output on the line 72 and to one of the inputs to the phase bridge 56 on line 54, as well as to the 400 Hz square wave on a line 86.

In order to utilize the RC/CR phase bridge 56 while yet deriving an output which is not out of phase (as a result of the inherent 45° phase lag of the bridge 56), the sum and scale circuit 50 provides a phase advance to the signals prior to application to the bridge. Derivation of the required scaling factor is as follows: desired outputs $$V_{52} = K_3 \sin wt \sin(\theta + 45) \quad (5)$$

$$V_{54} = K_3 \sin wt \cos(\theta + 45) \quad (6)$$

If inputs are $$V_{46} = -K_2/2 \sin wt\,(\sqrt{3}\cos\theta + \sin\theta) \quad (7)$$

$$V_{48} = -K_2/2 \sin wt\,(\sqrt{3}\cos\theta - \sin\theta) \quad (8)$$

It can be shown by substitution of input expressions corresponding to (7) and (8) above that $$V_{52} = \frac{1 + \frac{1}{\sqrt{3}}}{2} V_{46} - \frac{1 - \frac{1}{\sqrt{3}}}{2} V_{48} \quad (9)$$

and $$V_{54} = \frac{-1 + \frac{1}{\sqrt{3}}}{2} V_{46} + \frac{1 + \frac{1}{\sqrt{3}}}{2} V_{48} \quad (10)$$

Referring now to FIG. 3, the sum and scale circuit 50 includes a pair of operational amplifiers 94, 95 each having a respective feedback resistor R3, R6 and corresponding input resistors R1, R2; R4, R5. The resistor R2 and R4 are fed by inverters 98 which provide the minus sign in the numerator of the second term of equation (9) and the first term of equation (10). Since the closed loop gain of the amplifier is determined by the ratio of R3 to R1 for signals on the line 46 and given by the ratio of R3 to R2 for signals from the inverter 98, these resistors are chosen in ratios to satisfy equation (9), as follows $$\frac{R_3}{R_2} = \frac{1 - \frac{1}{\sqrt{3}}}{2} \approx .21 \quad (11)$$

and $$\frac{R_3}{R_1} = \frac{1 + \frac{1}{\sqrt{3}}}{2} \approx .79 \quad (12)$$

similarly $$\frac{R_6}{R_4} = \frac{-1 + \frac{1}{\sqrt{3}}}{2} \approx -.21 \quad (13)$$

and $$\frac{R_6}{R_5} = \frac{1 + \frac{1}{\sqrt{3}}}{2} \approx .79 \quad (14)$$

The actual values of the resistors are of course chosen in accordance with well known circuit technology to suit the impedance requirements of the amplifiers 94, 95 and the other associated circuitry.

The RC/CR phase bridge 56 is illustrated in FIG. 4. This comprises a pair of resistors 100, 102 and a pair of capacitors 104, 106, arranged in the form of a bridge as shown. The time constant of the leg 100, 106 is chosen to be equal to the time constant of the leg 102, 104, and this time constant provides electrical signals on lines 58 and 60 that vary in time phase relationship to the carrier frequency inputs on lines 52, 54, in a known fashion, as is fully described in a 1957 book by Alfred K. Susskind entitled "Notes on Analogue-Digital Conversion Techniques."

Figure 5:
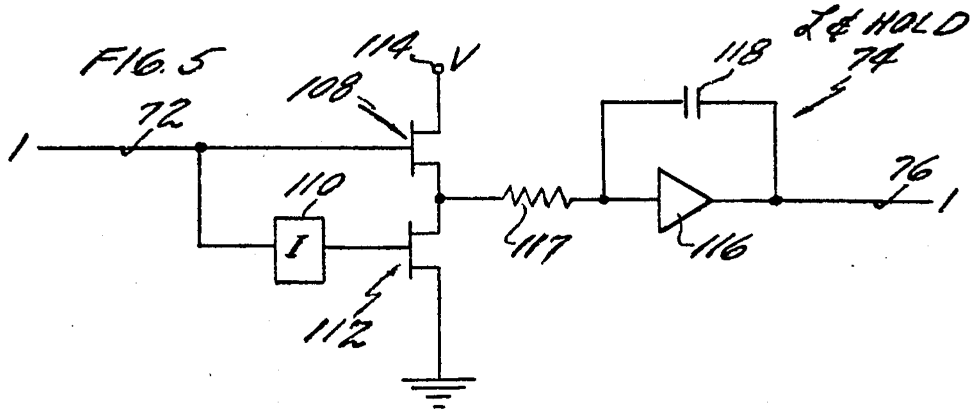
FIG. 5 is a simple schematic diagram of an integrate and hold circuit for incorporation in the embodiment of FIG. 2.

The integrate and hold circuit 74 may be of the type illustrated in FIG. 5. Therein, the input lead 72 is applied to the gate of a field effect type switching transistor 108 and, through an inverter 110, to the gate of a similar field effect switching transistor 112. So long as the output is present on the line 72, the transistor 108 conducts, so that a suitable voltage V is connected from a terminal 114 to the input of a high gain amplifier 116 through a resistor 117; the amplifier is strapped by a capacitor 118. The capacitor 118 charges, toward the value of the voltage V through the resistor 117 so long as the transistor 108 is conducting. However, once there is no longer a signal on the line 72, the inverter 110 will cause the gate of the transistor 112 to induce conduction therein, thereby bringing the input to the integrating amplifier 116 to ground. As is known, a strapped high gain integrating amplifier tends to hold its output when its input is grounded, whereby the output potential on the line 76 will remain at the potential it had achieved at the time that the conduction of the transistors 108, 112 switches. Thus the line 76 has a signal level equivalent to the pulsewidth of the pulse applied on the line 72.

Having thus described the system in brief and all of the circuitry with the exception of the combinational sign logic 88 which is described in detail with respect to FIG. 8 hereinafter, the ambiguity between shaft, or mechanical angles of $0°_m$–$180°_m$ and angles of $180°_m$–$360°_m$ will now be discussed in detail with respect to FIG. 6. The output 58 of the phase bridge 56 leads the signal phase reference (400 Hz supply) by the mechanical input from the servo while the output from the phase bridge on line 60 will lag the phase of the reference signal by the mechanical angle input from the synchro. Thus, the input to the pulsewidth modulator 70 on line 66 will be equal to the input to the pulsewidth modulator on line 68 for mechanical shaft angles of $180°_m$. This is shown in illustrations (a), (b) and (c) of FIG. 6 wherein the mechanical shaft angle of just under $180°_m$ ($180°_{m}$-) is illustrated. The output of the pulsewidth modulator is shown in illustration (d). Similarly, the input and outputs of the pulsewidth modulator is shown in illustrations (e) - (g) for angles just over $180°_m$, in illustrations (h) – (j) for angles just under $360°_m$, and in illustrations (k) - (m) for angles just over $360°_m$. Notice in illustrations (d) and (j) that the pulsewidth modulator output is the same for angles just under $180°_m$ and just under $360°_m$, and similarly, as shown in illustrations (g) and (m), the output is the same for angles just in excess of $180°_m$ and angles just in excess of $360°_m$.

Figure 6:
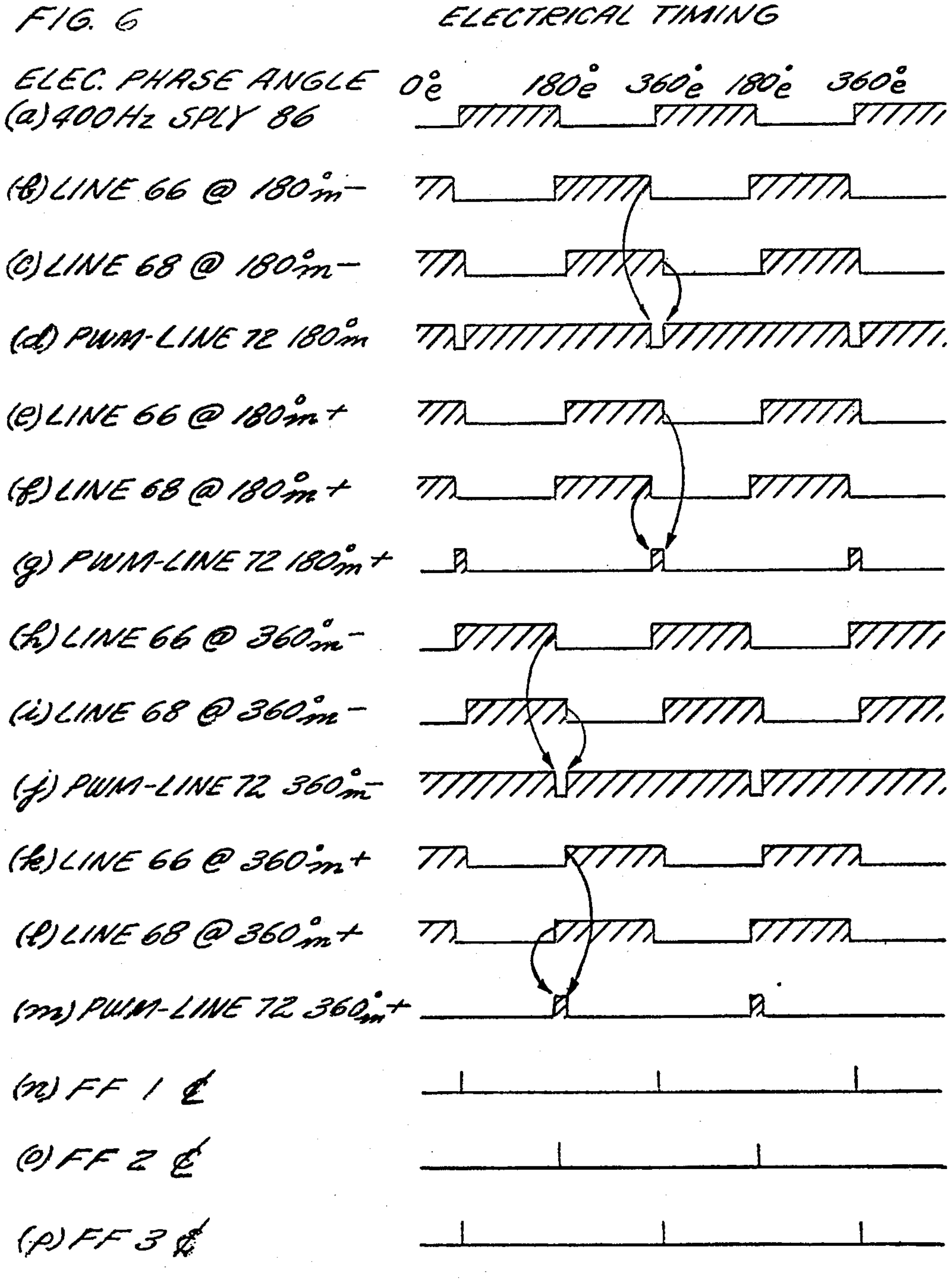
FIG. 6 is a timing diagram illustrating the relationships of the present invention.

Notice in FIG. 6 that the value of PWM changes abruptly from $180°_m{}^-$ to $180°_m{}^+$ and also changes abruptly from $360°_m{}^-$ to $360°_m{}^+$. However, also notice that the transition in the case of $180°_m$ is at $360°_e$ amd the transition at $360°_m$ is at $180°_e$. Thus, the PWM output can be resolved by comparison with the electrical reference phase.

Referring now to FIG. 8, three flip flops, designated FF-1, FF-2 and FF-3, respectively, each comprise a D type flip flop of the type having an input (D) and a clock input (₵) such that when there is a positive transition at the clock input, if the D input is positive, then the Q output will be positive and the $\overline{Q}$ output will be negative. Conversely, if when the ₵ input receives a positive transition, the D input is negative, then the $\overline{Q}$ output will be positive and the Q output will be negative. In FIG. 8, FF-1 is clocked with the 400 Hz supply on line 86, as is FF-3. But FF-2 is clocked by the output of an inverter 120 so that the clocking of FF-1 and FF-2 is alternative and interleaved. This is shown in illustrations (n) - (p) of FIG. 6. Since both FF-1 and FF-2 are responsive to the PWM output on the line 72, the action of these flip flops can be traced relative to mechanical degrees of shaft angle as illustrated in FIG. 7. Since FF-1 can only transition at 0° and 360° electrical, the conditions which obtain at that time are those which will control FF-1.

Comparing the mechanical angles $180°_m$ and $360°_m$ in FIG. 6, it can be seen that, to understand the relationship between FIGS. 6 and 7, care must be taken to avoid confusing mechanical degrees of rotation, which is very very slow, and the electrical reference phase angle which is extremely fast by comparison. Thus, FF-1 (FIG. 8) is sampled many times by the reference voltage as the mechanical position proceeds from just under $180°_m$ through $180°_m$ to just above $180°_m$ (and similarly around $360°_m$). At a mechanical rotation of just at $180°_m$, the pulsewidth modulation is zero, but at slightly above $180°_m$ it becomes positive again. Therefore, FF-1 will be set at a point just above $180°_m$, exactly which point is dependent upon small phase errors or noise and the actual resolution of the pulsewidth modulator. In any event, FF-1 will turn on at 360 electrical degrees ($360°_e$) at a point when the mechanical angle has just passed $180°_m$. FF-1 will remain on until the shaft angle increases to $360°_m$. At $360°_m$ minus a little bit, the input to FF-1 is still positive; but when it reaches 360°$_m$ it definitely becomes negative. In this case, however, the gating of FF-1 is very certain since the clock input to FF-1 falls midway between successive points at 180°$_e$ at which the pulsewidth of the signal on the line 72 transfers from very large to very small as a mechanical angle passes through 360°$_m$. In other words, FF-1 is set with some ambiguity at 180°$_m$ and is reset without ambiguity at 360°$_m$.

In contrast, FF-2 is gated at 180°$_e$. For reasons similar to those with respect to FF-1, FF-2 will be set with great assurance at 180°$_m$ and reset at 360°$_m$ with some ambiguity. Thus, the setting of FF-2 is without ambiguity and the resetting of FF-1 is without ambiguity. By taking the Q output of FF-2 and the Q output of FF-1, both of these flip flops will define the mechanical rotation between 180°$_m$ and 360°$_m$, but the start of the definition should be based on the setting of FF-2 and the end of the definition should be based on the resetting of FF-1. To achieve this, the D input to FF-3 is phase shifted so that its transitions occur in response to mechanical rotations different from those that are controlling FF-1 and FF-2. Notice that this signal (on line 54) is the cosine of the shaft angle (+45°$_m$) times the sine of the electrical angle. The cosine of the shaft angle plus 45°$_m$ goes to zero when the shaft angle is 45°$_m$, and is negative from shaft angles of 45°$_m$ around through shaft angles of 225°$_m$, at which time it becomes zero again. It is thereafter positive from shaft angles of 225°$_m$ to shaft angles of 45°$_m$. This results in the operation of flip flop 3 as shown in FIG. 7. Use of the phase shifted input on the line 54 is a clear indication of shaft angle rotations which are not changing at 0°$_m$, 180°$_m$ or 360°$_m$, since this change occurs 45°$_m$ in advancement thereof, but it is possible that the product, of the cosine of the shaft angle plus the phase shift and the sine of the electrical reference, may be zero at any given time due to the sine of the electrical reference being zero at the given moment. To avoid that situation, the reference angle is taken 25°$_e$ off so that it is never gated at sign of zero degrees, since clocking of FF-3 is done at 0°$_e$ of the reference, the signal will never be zero as a result of the sine of the reference at the time that FF-3 is clocked. This may be achieved in a passive 335°$_e$ delay circuit 122 (FIG. 8), the output of which is passed through a saturating amplifier 124, so as to form a square wave from the 25°$_e$ advanced sinusoidal input. This is applied to the D input of FF-3, which is clocked by the basic 400 Hz supply on the line 86. The transitions of FF-3 are plotted in FIG. 7. It can be seen that for rotations near 180°$_m$, FF-3 is in the reset state so that there is no signal at the Q output of FF-3. But for rotations near 360°$_m$, there is a signal on the Q output of FF-3. Thus, this output can be utilized to select the output of FF-1 as the resolving sign bit since FF-1 is without ambiguity at 360°$_m$ but is ambiguous at 180°$_m$. Similarly, the $\overline{Q}$ output of FF-3 may be utilized to gate the $\overline{Q}$ of FF-2 since it is unambiguous at 180°$_m$ but ambiguous at 360°$_m$ of mechanical rotation. This gating is the essential portion of that aspect of the invention which resolves the ambiguity between 0°$_m$ – 180°$_m$ and 180°$_m$ – 360°$_m$. This gating is achieved in FIG. 8 by a pair of AND circuits 126, 128 feeding an OR circuit 130.

Thus, there has been shown a digital shaft angle encoder which can encode, digitally, shaft angles of existing systems, thereby avoiding necessity to have encoders built directly into systems, the angle of which is to be determined. Also, the invention permits the use of a real-time phase bridge (having a phase-delayed output) without complex digital circuitry to provide an angular compensation for its output; this feature of the invention is achieved by the sum and scale circuit 50 as described hereinbefore. The present invention also provides a simple means of resolving the ambiguity for shaft angles between 0°$_m$ and 180°$_m$ and shaft angles between 180°$_m$ and 360°$_m$.

Although the invention has been shown and described with respect to a preferred embodiment thereof, it should be understood by those skilled in the art that various changes and omissions in the form and detail thereof may be made therein without departing from the spirit and the scope of the invention.

Having thus described a typical embodiment of our invention, that which we claim as new and desire to secure by Letters Patent of the United States is:

1. A shaft angle encoder comprising:

means including a reference voltage source, for providing differential signals together indicative of mechanical shaft angle;

circuit means connected for response to the signal outputs of said signals providing means for providing a pair of advance signals relating to an angle in advance of the shaft angle;

and RC/CR bridge responsive to said advance signals for providing output signals, the electrical phase difference of which is equal to twice the shaft angle;

means providing an output manifestation of the outputs of said bridge; and means concurrently responsive to said bridge outputs, at least one advance signal, and to said reference voltage source, for providing an output manifestation having two different states respectively representing outputs of said bridge corresponding to shaft angles of between 0° and 180° and outputs of said bridge corresponding to shaft angles of between 180° and 360°.

2. A shaft angle encoder comprising:

a reference voltage source;

a synchronous generator having a rotor connected to said reference voltage source to generate signals in stator windings thereof which signals are indicative of the angular rotation of said rotor with respect to said stator;

means responsive to said stator signals for providing a pulsewidth modulated indication of the angular rotation of said shaft, said means providing a pulsewidth of zero to maximum for shaft angles of 0° to 180° and also providing pulsewidth of zero to maximum for shaft angles of 180° to 360°; and means responsive to said pulsewidth modulated indication, to at least one signal derived from said stator signals and to said reference voltage for generating either one of two distinct manifestations in response to input signals thereto relating to shaft angles, one of said manifestations relating to shaft angles of between 180° and 360°.

3. The shaft angle encoder according to claim 2 wherein: said distinct manifestation generating means comprises a pair of flip flops clocked at alternate half cycles of said reference voltage, each of said flip flops responsive to said pulsewidth modulated indication at the clocking time thereof, and means responsive to the output of said flip flops for generating said manifestations.

4. A shaft angle encoder according to claim 3 wherein said distinct manifestation generating means further comprises means responsive to a signal related to but different in phase from at least a pair of said stator signals and related to but different in phase from said reference voltage for developing gating signals; and means responsive to said last named means for selectively gating the output of respective ones of said flip flops for use as said one output manifestation.

5. In a shaft angle encoder comprising a reference voltage source, a synchronous generator having a rotor connected to said reference voltage source to generate signals in stator windings thereof indicative of the angular rotation of said rotor with respect to said stator, and means including an RC/CR phase bridge for providing an electrical signal indication of the angular rotation of said rotor, the improvement comprising:

a sum and scale circuit responsive to signals derived from said stator signals for developing first and second signals in accordance with a relationship given as:

$V_{52} = K_3 \sin wt \sin (\theta + 45°)$ $V_{54} = K_3 \sin wt \cos (\theta + 45°)$ where $V_{52}$ is the first signal;

$V_{54}$ is the second signal;

$K_3$ is a constant;

$w$ is the angular frequency of the reference voltage source;

$t$ is time; and $\theta$ is the angular rotation of said rotor; said first and second signals being applied to said RC/CR phase bridge, whereby the phase difference of the outputs of said RC/CR phase bridge equals substantially twice the angular rotation of said rotor.

6. In a digital shaft angle encoder comprising a reference voltage source, a synchronous generator having a rotor connected to said reference voltage source to generate signals in stator windings thereof indicative of the angular rotation of said rotor with respect to said stator, and means responsive to said stator signals for generating a pulsewidth modulated signal indication of the angular position of said rotor, the improvement comprising:

an integrate and hold circuit means responsive to said pulsewidth modulation generating means;

an integrate and hold circuit means responsive to said reference voltage source;

and an analog to digital converter responsive to both of said integrate and hold circuit means for generating a digital manifestation of said pulsewidth modulation indication, whereby said digital output is insensitive to variations in said reference voltage source.

* * * * *